(12) United States Patent
Naganuma et al.

(10) Patent No.: US 9,553,251 B2
(45) Date of Patent: Jan. 24, 2017

(54) PIEZOELECTRIC DEVICE, LIQUID EJECTING HEAD, LIQUID EJECTING APPARATUS, AND MANUFACTURING METHOD OF PIEZOELECTRIC DEVICE

(71) Applicant: SEIKO EPSON CORPORATION, Tokyo (JP)

(72) Inventors: Yoichi Naganuma, Matsumoto (JP); Masao Nakayama, Shiojiri (JP); Eiju Hirai, Minowa-machi (JP); Takeshi Saito, Matsumoto (JP); Yoshihiro Hokari, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 13 days.

(21) Appl. No.: 14/875,730

(22) Filed: Oct. 6, 2015

(65) Prior Publication Data
US 2016/0101621 A1 Apr. 14, 2016

(30) Foreign Application Priority Data

Oct. 10, 2014 (JP) ................................. 2014-208893
Aug. 10, 2015 (JP) ................................. 2015-157970

(51) Int. Cl.
| | |
|---|---|
| *B41J 2/045* | (2006.01) |
| *H01L 41/047* | (2006.01) |
| *B41J 2/14* | (2006.01) |
| *H01L 41/08* | (2006.01) |

(Continued)

(52) U.S. Cl.
CPC .......... *H01L 41/047* (2013.01); *B41J 2/14233* (2013.01); *H01L 41/081* (2013.01); *H01L 41/0973* (2013.01); *H01L 41/332* (2013.01); *B41J 2002/14491* (2013.01)

(58) Field of Classification Search
CPC .. B41J 2/14209; B41J 2/14233; B41J 2/14274
See application file for complete search history.

(56) References Cited

U.S. PATENT DOCUMENTS

| | | | |
|---|---|---|---|
| 7,381,341 B2 * | 6/2008 | Shimada | .............. B41J 2/14233 216/27 |
| 2009/0284568 A1 | 11/2009 | Yazaki | |
| 2014/0232486 A1 | 8/2014 | Burak | |

(Continued)

FOREIGN PATENT DOCUMENTS

JP 2009-172878 A 8/2009

*Primary Examiner* — Juanita D Jackson
(74) *Attorney, Agent, or Firm* — Workman Nydegger

(57) ABSTRACT

A piezoelectric device includes a deformation portion, a non-deformation portion which hinders deformation of the elastic layer, and a piezoelectric element. The deformation portion includes a first area in which the piezoelectric element is disposed, a third area adjacent to the non-deformation portion, and a second area disposed between the first area and the third area. In the first area, the elastic layer, an insulation layer, the lower electrode layer, the piezoelectric layer, and the upper electrode layer are sequentially stacked. In the second area, the elastic layer, the insulation layer, the piezoelectric layer, and the upper electrode layer are sequentially stacked. In the third area, the elastic layer and the upper electrode layer are sequentially stacked. The elastic layer is silicon oxide, and impurities are added to the upper electrode layer in the silicon oxide in the third area.

15 Claims, 9 Drawing Sheets

(51) Int. Cl.
*H01L 41/09* (2006.01)
*H01L 41/332* (2013.01)

(56) References Cited

U.S. PATENT DOCUMENTS

2014/0267508 A1 9/2014 Ohashi et al.

* cited by examiner

PIEZOELECTRIC DEVICE, LIQUID EJECTING HEAD, LIQUID EJECTING APPARATUS, AND MANUFACTURING METHOD OF PIEZOELECTRIC DEVICE

CROSS-REFERENCE TO RELATED APPLICATIONS

The present application claims priority to Japanese Patent Application No. 2014-208893, filed on Oct. 10, 2014 and Japanese Patent Application No. 2015-157970, filed on Aug. 10, 2015, which applications are hereby incorporated by reference in their entirety.

BACKGROUND

1. Technical Field

The present invention relates to a piezoelectric device in which a plurality of piezoelectric elements is arranged in parallel, a liquid ejecting head including the piezoelectric device, a liquid ejecting apparatus including the liquid ejecting head, and a manufacturing method of the piezoelectric device.

2. Related Art

A liquid ejecting apparatus is an apparatus which includes a liquid ejecting head and ejects various types of liquid from the liquid ejecting head. As an example of such a liquid ejecting apparatus, there is an image recording apparatus such as an ink jet type printer or an ink jet type plotter, and recently, the liquid ejecting apparatus has been applied to various types of manufacturing apparatuses for the characteristic thereof that a very small amount of liquid can be landed accurately on a predetermined position. For example, the liquid ejecting apparatus has been applied to a display manufacturing apparatus which manufactures a color filter such as a liquid crystal display, an electrode forming apparatus which forms an electrode for an organic electro luminescence (EL) display, a field emission display (FED), or the like, and a chip manufacturing apparatus which manufactures a bio chip (biochemical element). A recording head of the image recording apparatus ejects ink of a liquid type, and a color material ejecting head for the display manufacturing apparatus ejects a solution of each color material of R (Red), G (Green), and B (Blue). In addition, an electrode material ejecting head for the electrode forming apparatus ejects an electrode material of a liquid type, and a biochemical organic substance ejecting head for the chip manufacturing apparatus ejects a bio organic substance solution.

The liquid ejecting head described above includes a plurality of pressure chambers and a piezoelectric device which generates the pressure fluctuation in liquid inside each pressure chamber. The piezoelectric device is configured to have a vibration plate which divides one side of the pressure chamber (for example, a side opposite to a nozzle plate on which nozzles are formed) and a piezoelectric element formed in every pressure chamber on the vibration plate. Here, the piezoelectric element is configured to have, for example, a lower electrode layer which functions as an individual electrode formed in every pressure chamber, a piezoelectric layer made of lead zirconate titanate (PZT), or the like and an upper electrode layer which functions as a common electrode common to a plurality of the pressure chambers, the layers sequentially stacked in this order from a side close to the vibration plate with a film deposition technology (for example, JP-A-2009-172878). In addition, a part of the piezoelectric layer sandwiched between the upper electrode layer and the lower electrode layer is a function portion which is deformed by applying a voltage to both electrode layers.

Here, when the piezoelectric layer is relatively thinner than the vibration plate, the rigidity of a part (arm portion) of the pressure chamber in which the piezoelectric layer is removed relatively increases so that the deformation of the piezoelectric element and the vibration plate is suppressed. Further, a problem in that reliability of the piezoelectric body itself deteriorates, or the like is generated. On the other hand, when the piezoelectric layer is relatively thicker than the vibration plate, rigidity of the piezoelectric element increases so that deformation efficiency of the piezoelectric element and the vibration plate deteriorate; however, reliability of the piezoelectric body is improved. Accordingly, deformation of the piezoelectric element and the thickness of the piezoelectric body (reliability) are inconsistent with each other.

SUMMARY

An advantage of some aspects of the invention is to provide a piezoelectric device which can achieve efficient deformation of a piezoelectric element while securing reliability of a piezoelectric element, a liquid ejecting head, and a liquid ejecting apparatus.

Application Example 1

According to this application example, there is provided a piezoelectric device including a deformation portion in which a first supporting layer is allowed to bend and deform; a non-deformation portion that is adjacent to the deformation portion, and hinders bending deformation of the first supporting layer; and a piezoelectric element in which a first electrode layer, a piezoelectric layer, and a second electrode layer are sequentially stacked, and makes the first supporting layer bent and deformed, in which the deformation portion includes a first area in which the piezoelectric element is disposed, a third area adjacent to the non-deformation portion, and a second area which is disposed between the first area and the third area, in the first area, the first supporting layer, a second supporting layer, the first electrode layer, the piezoelectric layer, and the second electrode layer are sequentially stacked, in the second area, the first supporting layer, the second supporting layer, the piezoelectric layer, the second electrode layer are sequentially stacked, in the third area, the first supporting layer and the second electrode layer are sequentially stacked, the first supporting layer is silicon oxide, and in the silicon oxide of the third area, impurities are added to the second electrode layer.

In this case, the first supporting layer of the deformation portion is bent and deformed by piezoelectric distortion of the piezoelectric element disposed in the first area. The first supporting layer in the third area is a supporting portion (arm portion) supporting the first supporting layer of the deformation portion. The first supporting layer of the deformation portion is bent and deformed using the first supporting layer of the third area as a fulcrum (origination of deformation).

Meanwhile, the first supporting layer in the third area is formed of silicon oxide and silicon oxide to which the impurities are added. In the silicon oxide to which the impurities are added, for example, crystal lattices thereof becomes disordered due to the impurities, and the silicon oxide is easily deformed in comparison with a case of silicon oxide to which the impurities are not added. For this reason, when the first supporting layer in the third area is formed of the silicon oxide and the silicon oxide to which the impurities are added, the first supporting layer in the third area is easily deformed in comparison with a case in which the first supporting layer in the third area is formed of only the silicon oxide.

Accordingly, the first supporting layer of the deformation portion which is bent and deformed using the first supporting layer in the third area as a fulcrum is easily deformed, and a deformation amount of the piezoelectric element (bending deformation of first supporting layer of deformation portion) is increased, deformation of the piezoelectric element can be performed efficiently. Further, since the deformation of the piezoelectric element is performed efficiently without changing a thickness (reliability) of the piezoelectric layer, high performance of the piezoelectric device can be achieved while securing the reliability of the piezoelectric device.

Application Example 2

In the piezoelectric device according to the application example, the impurities is preferably lead.

When the lead is added to the silicon oxide as impurities, the added lead is introduced to the silicon oxide as lead oxide, and thus a so called lead glass is formed. Further, Young's modulus of the silicon oxide (lead glass) to which the lead is added as the impurities is smaller than that of the silicon oxide to which the impurities are not added, and is easily deformed. Therefore, when the first supporting layer in the third area is formed of silicon oxide and silicon oxide (lead glass) to which the lead is added as the impurities, the first supporting layer in the third area is easily deformed in comparison with a case in which the first supporting layer in the third area is formed of only the silicon oxide.

Accordingly, the first supporting layer of the deformation portion which is deformed using the first supporting layer in the third area as a fulcrum is also easily deformed, a deformation amount of the piezoelectric element (bending deformation of first supporting layer of deformation portion) is increased, and deformation of the piezoelectric element can be performed efficiently. Further, since the deformation of the piezoelectric element is performed efficiently without changing a thickness (reliability) of the piezoelectric layer, high performance of the piezoelectric device can be achieved while securing the reliability of the piezoelectric device.

Application Example 3

According to this application example, there is provided a liquid ejecting head including the piezoelectric device according to the above described application example.

The piezoelectric device according to the above described application example can achieve high performance while securing the reliability. Accordingly, the liquid ejecting head which includes the piezoelectric device according to the above described application examples can also achieve the high performance while securing the reliability thereof.

Application Example 4

According to this application example, there is provided a liquid ejecting apparatus including the liquid ejecting head according to the above described application example.

The liquid ejecting head according to the above described application example can achieve high performance while securing the reliability. Accordingly, the liquid ejecting apparatus including the liquid ejecting head according to the above described application example can also achieve the high performance while securing the reliability thereof.

Application Example 5

According to this application example, there is provided a manufacturing method of a piezoelectric device, which includes a first area in which silicon oxide, a second supporting layer, a first electrode layer, a piezoelectric layer containing lead, and a second electrode layer are sequentially stacked, a second area in which the silicon oxide, the second supporting layer, the piezoelectric layer, and the second electrode layer are sequentially stacked, and a third area in which the silicon oxide and the second electrode layer are sequentially stacked, the method including, after forming the silicon oxide, the second supporting layer, and the piezoelectric layer, removing the second supporting layer and the piezoelectric layer formed in the third area, performing a heat process in a state in which the silicon oxide formed in the third area is separated from the piezoelectric layer, diffusing the lead in the piezoelectric layer to the silicon oxide formed in the third area, and adding the lead to the second electrode layer side of the silicon oxide in the third area as the impurities.

In the manufacturing method of the piezoelectric device according to the application example, since a heat process is performed in a state in which the silicon oxide formed in the third area is separated from the piezoelectric layer containing the lead, and the lead is diffused to the silicon oxide formed in the third area as the impurities, a lead amount diffused to the silicon oxide is small in comparison with a case of performing the heat process in a state in which the silicon oxide is adjacent to the piezoelectric layer, the defect that, for example, an excessive amount of the lead is diffused to the silicon oxide as the impurities, and the surface shape of the silicon oxide becomes disordered can be suppressed.

Further, since the amount of the lead which is diffused to the silicon oxide as the impurities can be adjusted by a separation distance (thickness of second supporting layer) between the silicon oxide and the piezoelectric layer containing the lead, the amount of the lead impurities which is diffused to the silicon oxide can be optimized by adjusting the separation distance (thickness of second supporting layer) between the silicon oxide and the piezoelectric layer containing the lead.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for realizing the invention will be described with reference to attached drawings. Moreover, in the embodiments to be described below, there are various limitations as preferred specific examples of the invention; however, a range of the invention is not limited to these aspects unless specified disclosure to limit the invention in a description herein below. In addition, in the description herein below, as a piezoelectric device according to the invention, a case in which an actuator for ejecting ink is used in an ink jet printer (hereinafter, refer to as printer) which is an example of a liquid ejecting apparatus on which an ink jet type recording head (hereinafter, refer to as head), which is an example of an liquid ejecting head, is mounted is exemplified.

Figure 1:
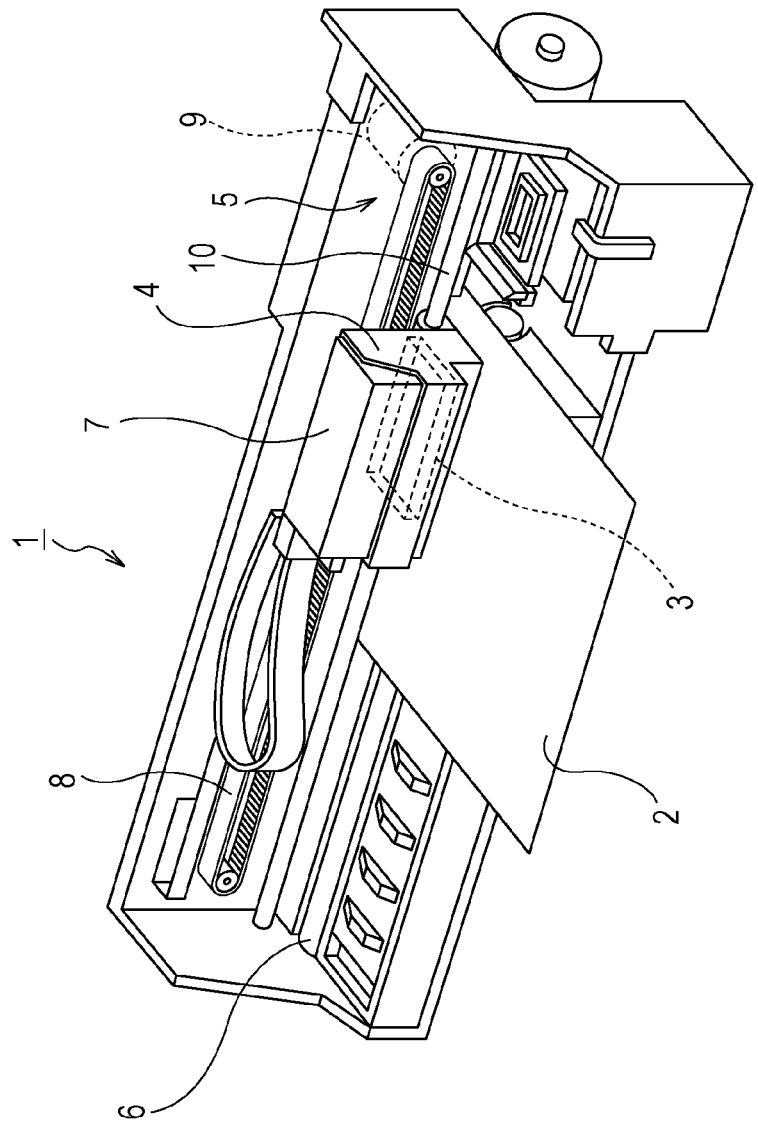
FIG. 1 is a perspective view illustrating a configuration of a printer.

A configuration of a printer 1 will be described with reference to FIG. 1. The printer 1 according to the embodiment is an apparatus which records an image, or the like by ejecting ink, which is a type of liquid, onto a surface of a recording medium 2 such as a recording sheet (a type of landing target). The printer 1 includes a recording head 3, a carriage 4 to which the recording head 3 is attached, a carriage moving mechanism 5 which moves the carriage 4 in a main scan direction, a transportation mechanism 6 which moves the recording medium 2 in a sub scan direction, and the like. Here, the ink described is reserved in an ink cartridge 7 as a liquid supply source. The ink cartridge 7 is detachably mounted in the recording head 3. Moreover, a configuration can be adopted in which the ink cartridge is disposed on the main body of a printer and the ink is supplied from the ink cartridge to the recording head through an ink supply tube.

The carriage moving mechanism 5 includes a timing belt 8. The timing belt 8 is driven by a pulse motor 9 such as a DC motor. Therefore, when the pulse motor 9 is operated, the carriage 4 is guided by a guide rod 10 provided in the printer 1 and is reciprocated in the main scan direction (width direction of recording medium 2).

Figure 2:
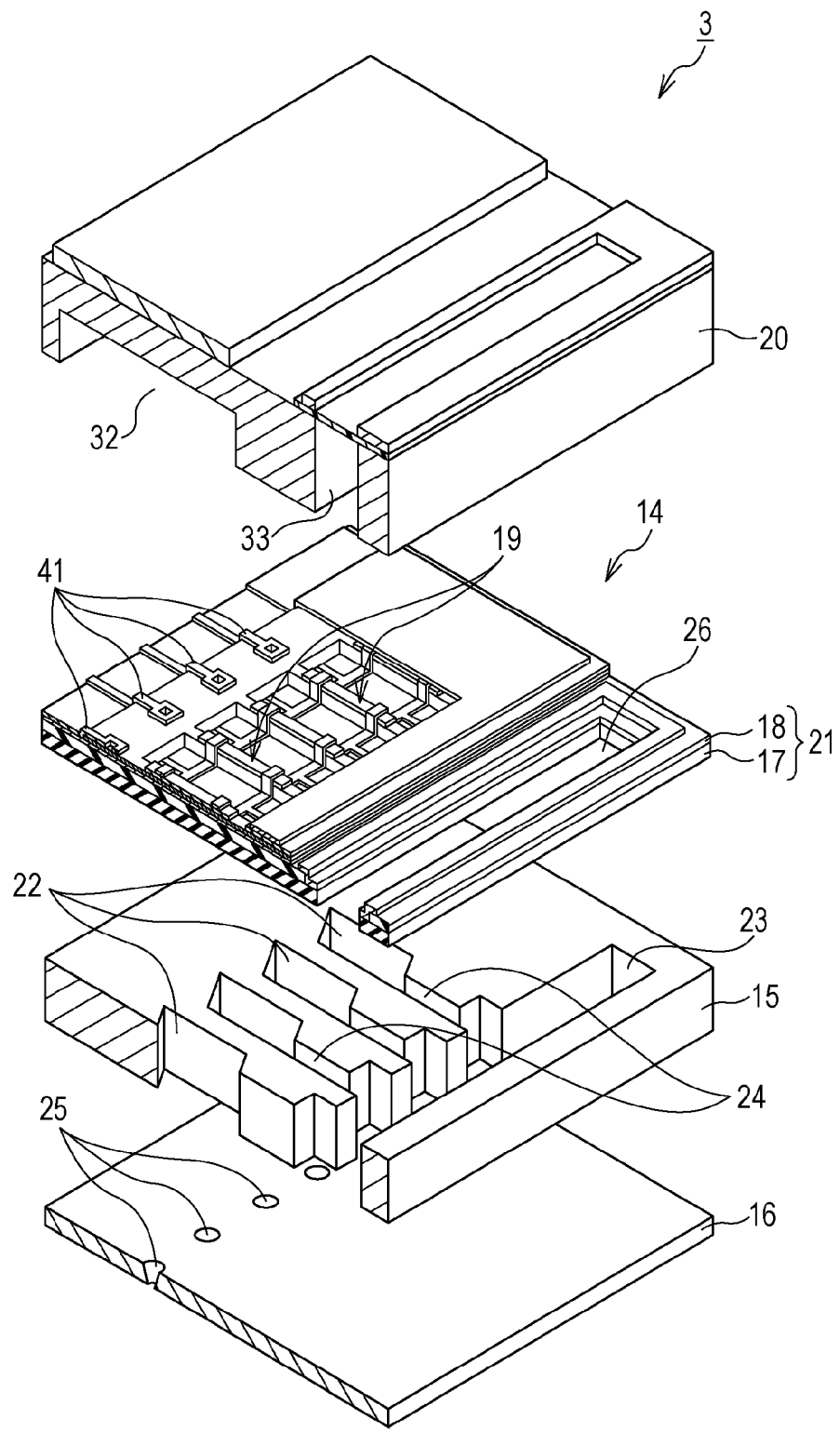
FIG. 2 is an exploded perspective view of a recording head.
Figure 3:
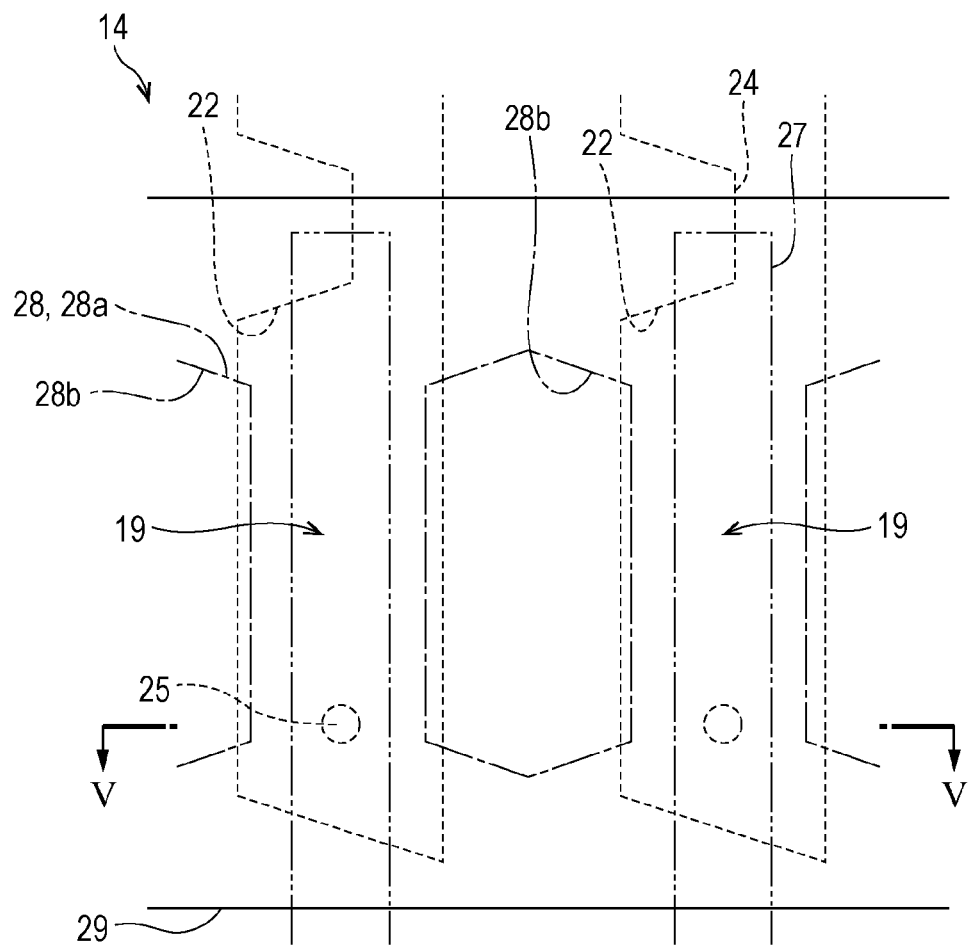
FIG. 3 is a plan view of a piezoelectric device.
Figure 4:
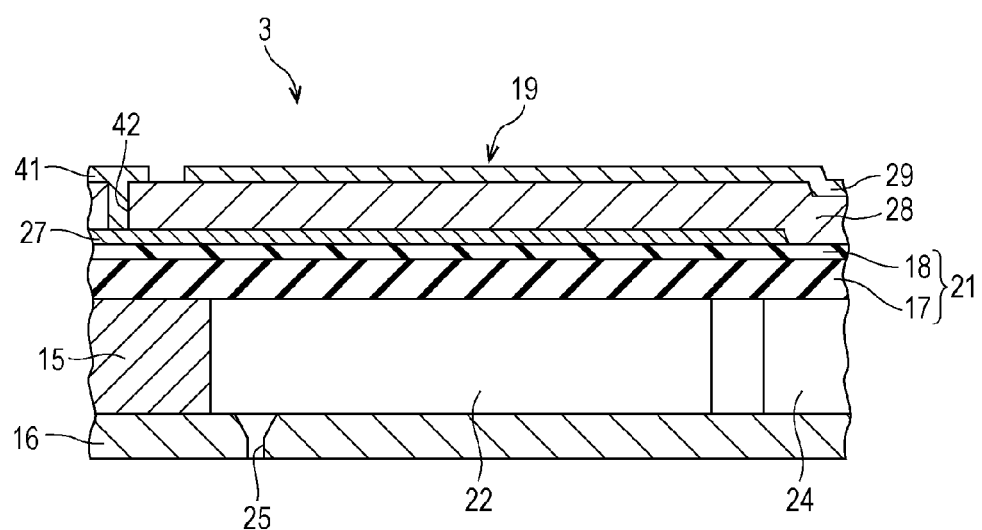
FIG. 4 is a schematic view illustrating a configuration of a main part of the recording head, which is a cross section taken along a direction orthogonal to a nozzle row.
Figure 5:
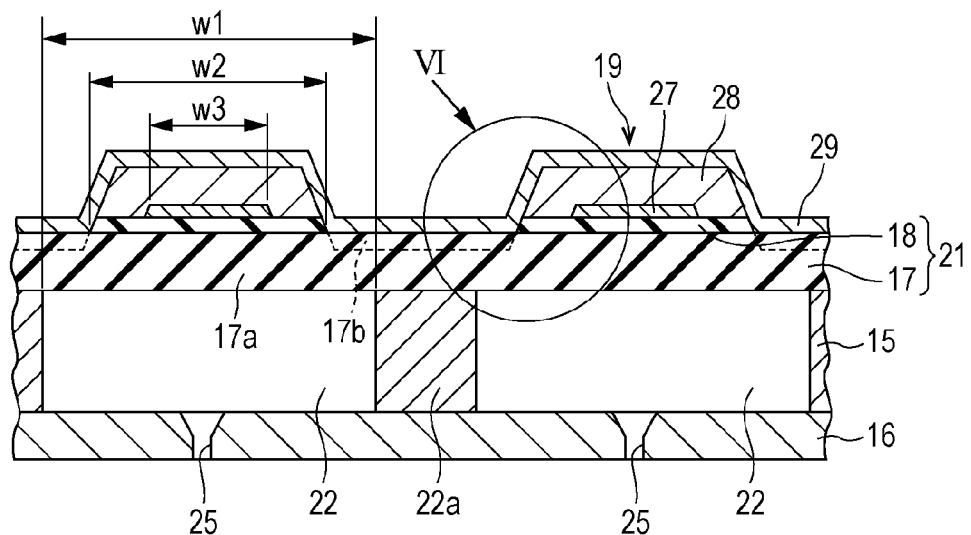
FIG. 5 is a cross sectional view taken along line V-V in FIG. 3.

FIG. 2 is an exploded perspective view illustrating a configuration of the recording head 3 of the embodiment. In addition, FIG. 3 is a plan view (top view) of a piezoelectric device 14 and is a plan view of the recording head 3 which is not bonded with a sealing plate 20 to be described later. Further, FIG. 4 and FIG. 5 are views illustrating a configuration of a main part of the recording head 3. FIG. 4 is a schematic view of a cross section taken along a direction orthogonal to a nozzle row, and FIG. 5 is a schematic view of a cross section (a cross section taken along line V-V in FIG. 3) taken along a direction of a nozzle row (a first direction or a width direction of a lower electrode layer 27 to be described below (transverse direction)).

The recording head 3 in the embodiment is configured by stacking a nozzle plate 16, a pressure chamber forming substrate 15, the piezoelectric device 14, the sealing plate 20, and the like. The pressure chamber forming substrate 15 is, for example, a plate member which is formed of a silicon single crystal substrate. In the pressure chamber forming substrate 15, as illustrated in FIG. 5, spaces (hereinafter, arbitrarily, referring to as a pressure chamber space), which are a plurality of pressure chambers 22, are arranged in parallel while respectively including a partition wall 22a being interposed therebetween. As illustrated in FIG. 3, the pressure chamber space (pressure chamber 22) is a space extended along a direction (second direction) orthogonal to a nozzle row direction, and corresponds to each of nozzles 25 of the nozzle plate 16 one to one. That is, each of the pressure chamber spaces (each pressure chamber 22) is arranged in parallel along the nozzle row direction at the same pitch as the formation pitch of the nozzles 25. Moreover, an upper opening (opening opposite to the nozzles 25) of the pressure chamber space (pressure chamber 22) in the embodiment, as illustrated in FIG. 3, is formed in a sectional trapezoidal shape. Regarding a size of the pressure chamber space, a height thereof (that is, a thickness of the pressure chamber forming substrate 15) is set to substantially 70 µm. In addition, a length (a size of the pressure chamber space in a direction orthogonal to a nozzle row direction or a pressure chamber parallel direction) of the pressure chamber space (for details, upper opening) is set to substantially 360 µm. Further, a width w1 (a size w1 of the pressure chamber space in the nozzle row direction or the pressure chamber parallel direction (referring to FIG. 5)) of the pressure chamber space (for details, upper opening) is set to substantially 70 µm.

In addition, as illustrated in FIG. 2, in the pressure chamber forming substrate 15, in an area deviated from a side (a side opposite to a side communicating with the nozzles 25) in a longitudinal direction of the pressure chamber space with respect to the pressure chamber space, a communication portion 23 penetrating the pressure chamber forming substrate 15 is formed along a parallel direction of the pressure chamber space (nozzle row direction). The communication portion 23 is a space common to each pressure chamber space. The communication portion 23 and each pressure chamber space communicate with each other through an ink supply passage 24. Moreover, a reservoir (common liquid chamber) which is an ink chamber common to each pressure chamber space (pressure chamber 22) is configured to have the communication portion 23 which communicates with a communication opening portion 26 of a vibration plate 21 and a liquid chamber space portion 33 of the sealing plate 20 to be described later. The ink supply passage 24 has a width narrower than that of the pressure chamber space, and is a part having passage resistance to the ink flowing into the pressure chamber space from the communication portion 23.

The nozzle plate 16 (nozzle forming substrate) is bonded to a lower surface of the pressure chamber forming substrate 15 (a surface of a side opposite to a surface side bonded to the piezoelectric device 14) by an adhesive, a heat-welding film, or the like. In the nozzle plate 16 in the embodiment, each of nozzles 25 is arranged in parallel at a pitch (that is, a distance between the centers of adjacent nozzles 25) corresponding to a dot formation density (for example, 300 dpi to 600 dpi). As illustrated in FIG. 3, each of the nozzles 25 communicates with an end portion of an opposite side to the ink supply passage 24 with respect to the pressure chamber space. Moreover, the nozzle plate 16 is formed of, for example, a silicon single crystal substrate, stainless steel, or the like.

As illustrated in FIG. 2, the piezoelectric device 14 is a device having a thin plate shape that functions as an actuator generating pressure fluctuation in the ink inside the pressure chamber 22, and is configured to have the vibration plate 21 and a plurality of the piezoelectric elements 19. The vibration plate 21 is configured to have an elastic layer 17 and an insulation layer 18. The elastic layer 17 (corresponding to a first supporting layer in the invention), which is formed of silicon oxide (SiOx) (for example, silicon dioxide (SiO$_2$)), is formed on an upper surface of the pressure chamber forming substrate 15. The insulation layer 18 (corresponding to a second supporting layer in the invention), which is formed of zirconium oxide (ZrOx) (for example, zirconium dioxide (ZrO$_2$)), is stacked on the elastic layer 17.

A part corresponding to the pressure chamber space in the vibration plate 21, that is, a part, which divides a part of the pressure chamber 22 by blocking the upper opening of the pressure chamber space, functions as a deformation portion which displaces (deforms) their positions in a direction far away from or close to the nozzles 25 according to the bending deformation of the piezoelectric element 19. In other words, an area corresponding to the pressure chamber space in the vibration plate 21 is the deformation portion, in which the bending deformation of the elastic layer 17 is allowed. An area deviated from the pressure chamber space in the vibration plate 21 is a non-deformation portion, in which the bending deformation of the vibration plate 21 (elastic layer 17) is hindered. The non-deformation portion is disposed to be adjacent to the deformation portion.

Figure 6:
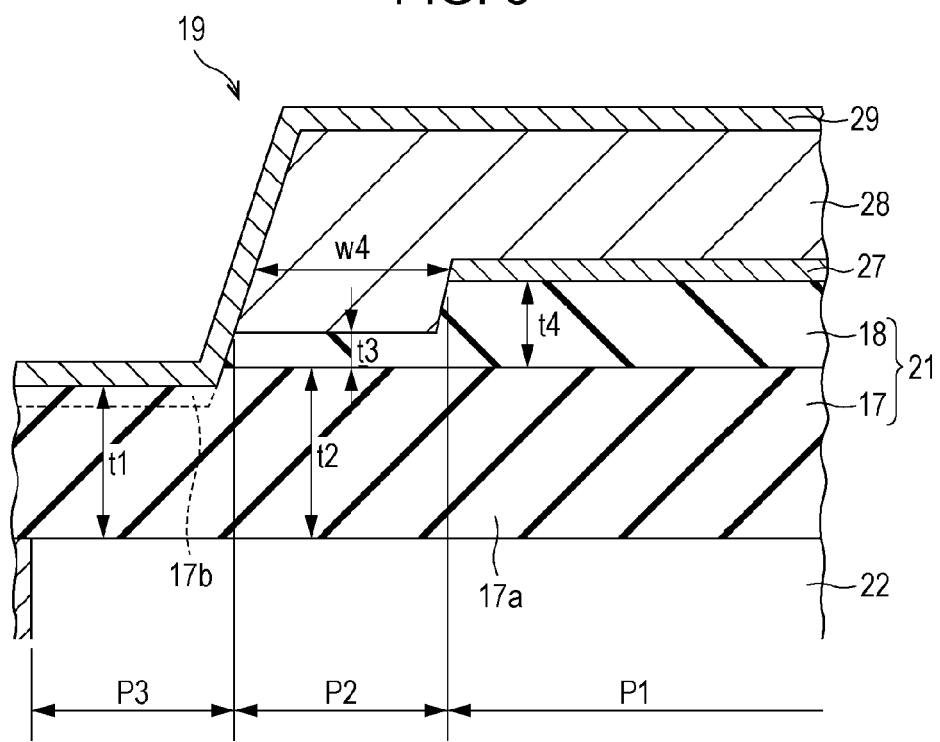
FIG. 6 is an enlarged view of an area VI in FIG. 5.

Here, as illustrated in FIG. 6, the vibration plate 21 in the deformation portion (an area corresponding to the pressure chamber space) can be divided into three areas P1, P2, and P3 with a positional relationship between an upper electrode layer 29 to be described later, a piezoelectric layer 28, and the lower electrode layer 27. In addition, as illustrated in FIG. 5 and FIG. 6, the insulation layer 18 between the piezoelectric elements 19 (for details, area P3) is removed, and the piezoelectric elements 19 is disposed on the area P1. Moreover, the thickness of the vibration plate 21 of each of areas P1, P2, and P3 will be described in detail. In addition, as illustrated in FIG. 2, in a part corresponding to the communication portion 23 of the pressure chamber forming substrate 15 in the vibration plate 21, the communication opening portion 26 communicating with the corresponding communication portion 23 is provided.

In other words, the deformation portion (the area corresponding to the pressure chamber space) includes the area P1 in which the piezoelectric element 19 is disposed, the deformation portion the area P3 adjacent to the non-deformation portion (an area deviated from the pressure chamber space), and the area P2 which is disposed between the area P1 and the area P3.

Moreover, the area P1 is an example of a "first area", the area P2 is an example of a "second area", and the area P3 is an example of a "third area".

In a part corresponding to the pressure chamber space of the vibration plate 21 (insulation layer 18), in other words, in an upper surface (a surface of a side opposite to the nozzle 25) of the deformation portion of the pressure chamber 22, the piezoelectric element 19 is respectively formed. That is, according to the pressure chamber spaces which are arranged in parallel along the nozzle row direction, the piezoelectric elements 19 are arranged in parallel along the nozzle row direction. As illustrated in FIG. 4 and FIG. 5, the piezoelectric elements 19 in the embodiment are configured to have the lower electrode layer 27 (corresponding to a first electrode layer in the invention), the piezoelectric layer 28, and the upper electrode layer 29 (corresponding to a second electrode layer in the invention) which are stacked sequentially on the insulation layer 18 with a film deposition technology.

Moreover, the upper electrode layer 29 and the lower electrode layer 27 are formed of various metals such as iridium (Ir), platinum (Pt), titanium (Ti), tungsten (W), tantalum (Ta), and molybdenum (Mo), or alloys thereof. An example of an alloy electrode includes LaNiO$_3$, or the like. In addition, as the piezoelectric layer 28, a ferroelectric piezoelectric material, for example, lead zirconate titanate (PZT) including lead (Pb) titanium (Ti), and zirconium (Zr), or a relax or ferroelectric material in which metals such as niobium, nickel, magnesium, bismuth, or yttrium are added to the ferroelectric piezoelectric material, and the like is used. In addition to, it is possible to also use non-lead materials such as barium titanate. Further, in regard to the thickness of a film, the thickness of the upper electrode layer 29 is preferably set to 15 nm to 100 nm, and in this embodiment, the thickness thereof is set to substantially 70 nm. In addition, a thickness of the piezoelectric layer 28 (for details, the thickness of the piezoelectric layer 28 in the area P1) is preferably set to 0.7 μm to 5 μm, and in this embodiment, the thickness thereof is set to substantially 1 μm. Further, a thickness of the lower electrode layer 27 is preferably set to 50 nm to 300 nm, and in this embodiment, the thickness thereof is set to substantially 150 nm.

Here, as illustrated in FIG. 5, the lower electrode layer 27 is provided independently in every pressure chamber 22, but the upper electrode layer 29 is successively provided throughout a plurality of the pressure chambers 22. Accordingly, the lower electrode layer 27 is a separate electrode provided in every pressure chamber 22, and the upper electrode layer 29 is a common electrode common to each of the pressure chambers 22.

Specifically, as illustrated in FIG. 3 and FIG. 5, both end portions in the nozzle row direction of the upper electrode layer 29 are provided so as to extend over an edge of the upper opening of the pressure chamber space to the outside of a plurality of the pressure chamber spaces (pressure chamber 22) which are arranged in parallel. Moreover, the both end portions in a longitudinal direction (a direction orthogonal to the nozzle row direction) of the pressure chamber 22 (pressure chamber space) of the upper electrode layer 29 are provided so as to extend to the outside of the corresponding pressure chamber space (the pressure chamber 22) over the edge of the upper opening of the pressure chamber space. Meanwhile, the lower electrode layer 27 extends to a position where an end portion of one side (upper side in FIG. 3) overlaps the ink supply passage 24 over an edge of the upper opening of the pressure chamber 22 in the longitudinal direction of the pressure chamber 22 (pressure chamber space), and an end portion of another side (lower side in FIG. 3) extends to a lead electrode portion 41.

In addition, in the embodiment, as illustrated in FIG. 5, a width w3 of the nozzle row direction of the lower electrode layer 27 on the pressure chamber space (an area corresponding to the pressure chamber 22) is formed to be narrower than the width w1 of the same direction of the pressure chamber 22 (for details, the upper opening of the pressure chamber space). Further, the piezoelectric layer 28 on the pressure chamber space extends to the outside of the lower electrode layer 27 in the nozzle row direction, and a width w2 of the nozzle row direction is formed to be narrower than the width w1 of the same direction of the pressure chamber 22 and is wider than the width w3 of the same direction of the lower electrode layer 27. That is, sizes of the nozzle row direction are short in the order of the width of the upper electrode layer 29, the width w1 of the pressure chamber 22, the width w2 of the piezoelectric layer 28, and the width w3 of the lower electrode layer 27.

Here, the width w2 of the piezoelectric layer 28 of the nozzle row direction on the pressure chamber space is preferably set to 30 μm to 60 μm, and in the embodiment, the width thereof is set to substantially 52 μm. In addition, the width w3 of the lower electrode layer 27 is preferably set to 15 μm to 60 μm, and in the embodiment, the width thereof is set to substantially 40 μm. Further, a distance from an external end portion of one side of the lower electrode layer 27 to an external end portion of the same side of the piezoelectric layer 28 (that is, a width w4 of an area P2 of one side in the nozzle row direction (referring to FIG. 6)) is preferably set to 2.5 μm to 8.0 μm, and in the embodiment, the distance thereof is set to substantially 6 μm.

In addition, in the embodiment, as illustrated in FIG. 3, the piezoelectric layer 28 is separated in every piezoelectric element 19 by an opening portion 28b in which the piezoelectric layer 28 (a PZT layer 28a which is the piezoelectric layer 28) is partially removed. Specifically, the piezoelectric layer 28 extends to the outside over the both end portions of the longitudinal direction of the pressure chamber 22 (for details, an edge of the upper openings of both sides of the pressure chamber space), and is formed throughout the plurality of the pressure chambers 22. Therefore, the piezoelectric layer 28 of the corresponding area between the adjacent pressure chambers 22 is partially removed, and the opening portion 28b in which the piezoelectric layer 28 is not stacked is formed in plural. That is, the plurality of the opening portions 28b is formed along the nozzle row direction at the same pitch as the formation pitch (formation pitch of nozzle 25) of the pressure chamber 22. In other words, between the opening portion 28b and the opening portion 28b, the piezoelectric element 19 corresponding to one pressure chamber 22 is formed at the same pitch as the formation pitch of the pressure chamber 22. Moreover, the opening portion 28b in the embodiment, in a plan view, is formed to be long in a hexagonal shape along the longitudinal direction of the pressure chamber 22. In addition, in the longitudinal direction of the pressure chamber 22, the piezoelectric layer 28 of the area deviated from the opening portion 28b is successively formed throughout the plurality of pressure chambers 22.

Further, in the embodiment, as illustrated in FIG. 4, on the piezoelectric layer 28 in an area deviated from outside of the longitudinal direction of the pressure chamber space further than the edge of the upper opening of the pressure chamber space, the lead electrode portion 41 is formed at a position (a position in the left side in FIG. 4) at predetermined intervals with respect to the upper electrode layer 29. The lead electrode portion 41 is patterned according to the lower electrode layer 27 which is a separate electrode, and transfers a driving voltage (driving pulse) to each piezoelectric element 19. That is, the driving voltage (driving pulse) is selectively applied to each piezoelectric element 19 through the lead electrode portion 41. Moreover, a through hole 42 is formed from the upper surface of the piezoelectric layer 28 to the lower electrode layer 27 in the piezoelectric layer 28 in the lead electrode portion 41 in a state of penetrating the piezoelectric layer 28. The lead electrode portion 41 is electrically connected to the lower electrode layer 27 through the through hole 42.

As illustrated in FIG. 2, the sealing plate 20 is bonded to an upper surface opposite to a lower surface which is a surface bonded to the pressure chamber forming substrate 15 in the piezoelectric device 14. The sealing plate 20 includes an accommodation space portion 32 which is capable of accommodating the piezoelectric element 19 and the liquid chamber space portion 33 formed on the area corresponding to the communication opening portion 26 of the vibration plate 21 and the communication portion 23 of the pressure chamber forming substrate 15, at a position deviated to the outside of the direction orthogonal to the nozzle row than the accommodation space portion 32. The liquid chamber space portion 33 is formed in a parallel direction of the pressure chamber space (the pressure chamber 22) by being penetrated in a thickness direction of the sealing plate 20, and as described above, a reservoir, which is an ink chamber common to each pressure chamber space, is dividedly formed by making the communication opening portion 26 and the communication portion 23 communicate with each other in series. Moreover, it is not illustrated, in the sealing plate 20, in addition to the accommodation space portion 32 and the liquid chamber space portion 33, a wire opening portion penetrating the sealing plate 20 in the thickness direction is provided, and an end portion of the lead electrode portion 41 is exposed in the wire opening portion. A terminal of a wire member (not illustrated) from the printer main body is electrically connected to the exposed part of the lead electrode portion 41.

Such a recording head 3 fills the inside of a series of ink passages reaching the nozzles 25 with the ink by supplying the ink from the ink cartridge 7 at the time of ejecting the ink through the reservoir, the ink supply passage 24, the pressure chamber 22, and the like. By receiving the driving signal from the printer main body, when an electric field is applied between the lower electrode layer 27 and the upper electrode layer 29 respectively corresponding to the pressure chamber 22 in response to a potential difference of both electrodes, the deformation portions of the piezoelectric element 19 and the vibration plate 21 (elastic layer 17) displace the positions, and pressure fluctuation is generated in the pressure chamber 22. The ink is ejected from the nozzle 25 by controlling the pressure fluctuation.

Here, in the piezoelectric device 14 according to the invention, as described above, since the piezoelectric element 19 in which the lower electrode layer 27, the piezoelectric layer 28, and the upper electrode layer 29 are stacked is formed. In the three areas P1, P2, and P3 of the described above deformation portion (the area corresponding to the pressure chamber space), each of the layers 27, 28, and 29 is differently overlapped. In detail, as illustrated in FIG. 6, the lower electrode layer 27, the piezoelectric layer 28, and the upper electrode layer 29 are sequentially stacked in the area P1, the piezoelectric layer 28 and the upper electrode layer 29 are sequentially stacked in the area P2, and only the upper electrode layer 29 is disposed in the area P3. That is, the piezoelectric element 19 is disposed in the area P1, and a part of configuration components of the piezoelectric element 19 is disposed in the area P2 and the area P3.

Further, the elastic layer in a case in which the elastic layer 17 is a reference, the elastic layer the elastic layer 17, and the insulation layer 18, the lower electrode layer 27, the piezoelectric layer 28, and the upper electrode layer the upper electrode layer 29 are sequentially stacked in the area P1. The elastic layer 17, the insulation layer 18, and the piezoelectric layer 28, and the upper electrode layer the upper electrode layer 29 are sequentially stacked in the area P2. The elastic layer 17 and the upper electrode layer the upper electrode layer 29 are sequentially stacked in the area P3.

Moreover, in the embodiment, each of areas P1, P2, and P3 is formed in both sides of the nozzle row direction on the deformation portion of the vibration plate 21 (elastic layer 17); however, since it is a bilaterally asymmetric, the areas will be described by focusing on one side of the area.

On the vibration plate 21 in the above described area P1, the piezoelectric layer 28 is sandwiched between the lower electrode layer 27 and the upper electrode layer 29. For this reason, the piezoelectric layer 28 stacked on the area P1 becomes a functioning portion in which piezoelectric distortion is generated by applying the voltage to the both electrode layers. Meanwhile, the piezoelectric layer 28 is not sandwiched between the lower electrode layer 27 and the upper electrode layer 29, but the piezoelectric layer 28 is sandwiched between the vibration plate 21 (insulation layer 18) and the upper electrode layer 29, on the vibration plate 21 in the area P2 in which the lower electrode layer 27 is not formed. For this reason, the piezoelectric layer 28 stacked on the area P2 becomes a non-functioning portion in which piezoelectric distortion is not generated even when applying a voltage to both electrode layers. The piezoelectric layer 28 is not disposed on the area P3, and the area P3 is the non-functioning portion same as the area P2.

That is, the piezoelectric distortion is generated in the piezoelectric element 19 in the area P1, and a force for bending deformation (force for vibrating) acts on the vibration plate 21. The vibration plate 21 of the area P3 is a supporting portion (arm portion) which supports the vibration plate 21 of the deformation portion (the area corresponding to the pressure chamber space), and using the vibration plate 21 of the area P3 as a fulcrum (origination of deformation), the vibration plate 21 of the deformation portion is bent and deformed in a direction far away from the nozzle 25 or a direction close to the nozzle 25. For example, when the vibration plate 21 of the area P3 is not easily deformed, the vibration plate 21 of the deformation portion is not easily deformed, and when the vibration plate 21 of the area P3 is easily deformed, the vibration plate 21 of the deformation is easily deformed.

In addition, in the recording head 3 according to the embodiment, since the vibration plate 21 of the area P3 is easily deformed more than the vibration plate 21 of the other areas (area P1 and area P2), the vibration plate 21 of the deformation portion is easily bent and deformed, and the vibration plate 21 of the deformation portion can be greatly bent and deformed.

For more details, in the recording head 3 according to the invention, the thickness of the vibration plate 21 in the area P3 (arm portion) farther away than an area where the piezoelectric layer 28 is stacked is thinner than the thickness of the vibration plate 21 in the areas P1 and P2 where the piezoelectric layer 28 is stacked. In other words, the thicknesses of the vibration plate 21 in the areas P1 and P2 are thicker than the thickness of the vibration plate 21 in the area P3. Specifically, the insulation layer 18 in the area P3 is removed, and the upper electrode layer 29 is directly stacked on the elastic layer 17. Specifically, in the embodiment, the thickness t1 of the elastic layer 17 in the area P3 is thinner than the thickness t2 of the elastic layer 17 in the areas P1 and P2. That is, the thickness t2 of the elastic layer 17 in the areas P1 and P2 in which the piezoelectric layer 28 and the upper electrode layer 29 are stacked is thicker than the thickness t1 of the elastic layer 17 in the area P3 in which the upper electrode layer 29 is stacked on the elastic layer 17, in the outside of the nozzle row direction farther away than the piezoelectric layer 28. Accordingly, the thickness of the vibration plate 21 in the area P3 can be reduced more than the thickness of the vibration plate 21 in the areas P1 and P2.

In addition, in the embodiment, the thickness t3 of the insulation layer 18 in the area P2 is thinner than the thickness t4 of the insulation layer 18 in the area P1. That is, the thickness t4 of the insulation layer 18 in the area P1 in which the lower electrode layer 27, the piezoelectric layer 28, and the upper electrode layer 29 are stacked is thicker than the thickness t3 of the insulation layer 18 in the area P2 in which the piezoelectric layer 28 and the upper electrode layer 29 are stacked, in the outside of the nozzle row direction farther away than the lower electrode layer 27. Accordingly, the thickness of the vibration plate 21 in the area P1 can be thicker than the thickness of the vibration plate 21 in the area P2. That is, a relationship between the thicknesses of the vibration plate 21 in each of the areas P1, P2, and P3 of the vibration plate 21 is satisfied with an expression of P1>P2>P3 (that is, (t2+t4)>(t2+t3)>t1).

Moreover, a difference between the thickness of the vibration plate 21 of the area P1 and the thickness of the vibration plate 21 of the area P2, and a difference between the thickness of the vibration plate 21 of the area P2 and the thickness of the vibration plate 21 of the area P3 are respectively preferably set to 5 nm to 50 nm, and are more respectively preferably 10 nm or more. For example, the thickness of the elastic layer 17 in the areas P1 and P2 is set to substantially 1500 nm, the thickness of the insulation layer 18 in the area P1 is set to substantially 420 nm, and the thickness of the insulation layer 18 in the area P2 is set to substantially 380 nm. Accordingly, while the rigidity of the piezoelectric layer 28 can reliably increase, a hindrance of the movement of the vibration plate 21 in the outside of the piezoelectric layer 28 can be reliably suppressed. In addition, the thickness of the elastic layer 17 in each of areas P1, P2, and P3 is preferably set to 300 nm to 2000 nm. Further, the thickness of the insulation layer 18 in the area P1 is preferably set to 600 nm or less.

Accordingly, by removing the insulation layer 18 of the area P3 positioned in the outside farther away than the piezoelectric layer 28, while maintaining the thickness of the vibration plate 21 of the areas P1 and P2 in which the piezoelectric layer 28 is respectively stacked, the thickness of the vibration plate 21 of the area P3 can be thinned. Accordingly, while securing a thickness (film thickness) of the piezoelectric layer 28 which obtains sufficient reliability, the deformation efficiency of the piezoelectric element 19 can be improved by decreasing the rigidity of the area P3 positioned in the outside farther away than the piezoelectric layer 28. As a result, a deformed amount of the piezoelectric element 19 can increase.

Further, the embodiment includes a configuration in which the vibration plate 21 of the area the area P3 can be further easily deformed and the deformation amount of the piezoelectric element the piezoelectric element 19 (bending deformation of vibration plate 21 of deformation portion) can be further increased. Hereinafter, the embodiment including the configuration will be described in detail.

As described above, the pressure chamber forming substrate 15 is formed of a silicon single crystal substrate. As illustrated in FIG. 5 and FIG. 6, the elastic layer 17 of the areas P1 and P2 is a silicon oxide 17a formed by thermally oxidizing a silicon constituting the pressure chamber forming substrate 15. The silicon oxide 17a formed by thermally oxidizing the silicon is an amorphous silicon oxide in which impurities barely contained, and the silicon oxide 17a is easily deformed further than a crystalline silicon oxide.

The elastic layer 17 of the area P3 is configured to have the silicon oxide 17a which is formed by thermally oxidizing the silicon constituting the pressure chamber forming substrate 15 and a silicon oxide 17b including the upper electrode layer 29 of the silicon oxide 17a to which lead is added as the impurities.

When lead is added to the silicon oxide 17a as the impurities, the added lead is introduced to the silicon oxide 17a as lead oxide, and thus, the silicon oxide 17a becomes a glass containing the lead oxide. That is, the silicon oxide 17b is a glass containing the lead oxide, a so called a lead glass. Young's modulus of the silicon oxide 17a (silicon oxide not containing impurities) is approximately 70 GPa. Young's modulus of the silicon oxide 17b (lead glass) is smaller than approximately 60 GPa. Since the Young's modulus of the silicon oxide 17b is smaller than the Young's modulus of the silicon oxide 17a, the silicon oxide 17b is easily deformed more than the silicon oxide 17a.

As seen from the above, in the embodiment, since the elastic layer 17 of the area P3 is formed of the silicon oxide 17a and the silicon oxide 17b (lead glass) in which the lead is added to the upper electrode layer 29 of the silicon oxide 17a as the impurities, in comparison with a case in which the elastic layer 17 of the area P3 is formed of only the silicon oxide 17a the elastic layer 17 of the area P3 is easily deformed, and the deformation amount of the piezoelectric element 19 (bending deformation of the vibration plate 21 of the deformation portion) is further increased, therefore, deformation of the piezoelectric element 19 can be performed efficiently.

Further, since deformation of the piezoelectric element 19 is performed efficiently without changing the thickness (reliability) of piezoelectric layer 28, the piezoelectric element 19 can achieve high performance while securing the reliability of the piezoelectric element 19. Accordingly, the piezoelectric device 14 can achieve high performance while securing reliability thereof.

Therefore, the pressure fluctuation by the deformation of the piezoelectric element 19 can be efficiently transferred to the ink inside the pressure chamber 22. That is, transmission loss of the driving force of the piezoelectric element 19 with respect to the ink inside the pressure chamber 22 can be reduced. Accordingly, a driving voltage of the piezoelectric element 19 needed to eject a predetermined amount of the ink from the nozzles 25 can be decreased, and thus effective power saving can be achieved and a life span of the piezoelectric element 19 can be increased. As a result, the reliability of the recording head 3 is improved. In addition, the insulation layer 18 made of zirconium oxide (ZrOx) is formed on the areas P1 and P2 in which the piezoelectric layer 28 is stacked so that when the piezoelectric layer 28 made of lead zirconate titanate (PZT) is formed by firing, it is possible to prevent lead contained in the piezoelectric layer 28 from diffusing into the lower layer (elastic layer 17).

Figure 7A:
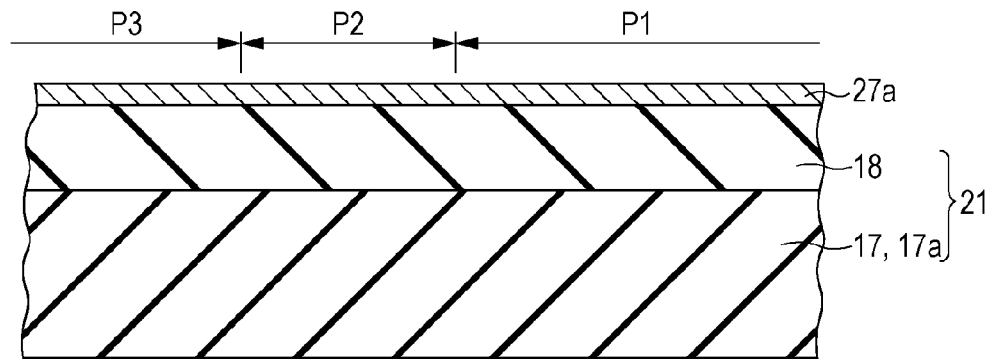
FIGS. 7A to 7C are schematic views illustrating a formation process of a vibration plate.
Figure 7B:
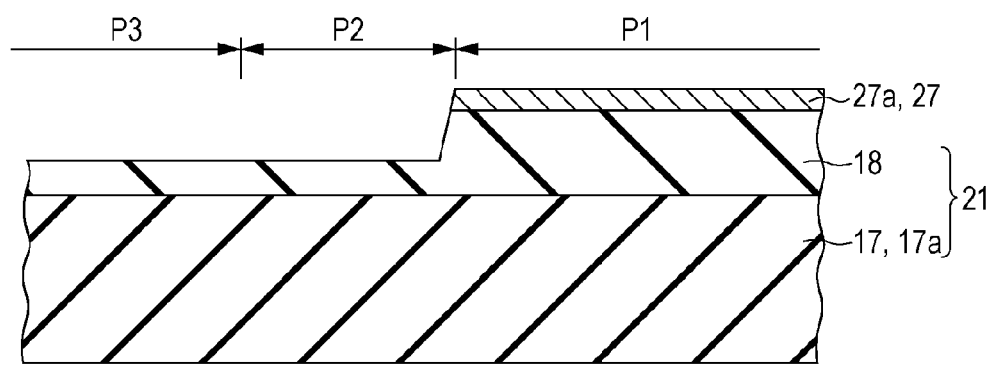

Next, a manufacturing method of the piezoelectric device 14 will be described. First, the insulation layer 18 made of zirconium oxide (ZrOx) is formed on the elastic layer 17 made of silicon oxide (SiOx) by a sputtering method, or the like. Next, as illustrated in FIG. 7A, a lower metal layer 27a, which is the lower electrode layer 27, is formed on the area P1, the area P2, and the area P3, by the sputtering method on the entire surface of the insulation layer 18, or the like. Subsequently, the lower electrode layer 27 is formed in the area P1 by etching the lower metal layer 27a. Specifically, by the photolithographic method, a resist pattern as a mask with respect to the etching is provided on the lower metal layer 27a, and after the lower metal layer 27a is etched from the upper surface side by an etching solution such as a solution, the resist pattern is removed. At this time, the etching is carried out as the thickness of the lower metal layer 27a or more by controlling etching time, or the like, as illustrated in FIG. 7B, the insulation layer 18 of the area P2 and the area P3 is etched. Accordingly, the insulation layer 18 corresponding to the area P1 of the vibration plate 21 is not etched, and the insulation layer 18 corresponding to the areas P2 and P3 of the vibration plate 21 is over-etched. As a result, a step is formed on a boundary between the area P1 and the area P2, and the insulation layer 18 of the areas P2 and P3 is positioned one step lower than the insulation layer 18 of the area P1.

Figure 7C:
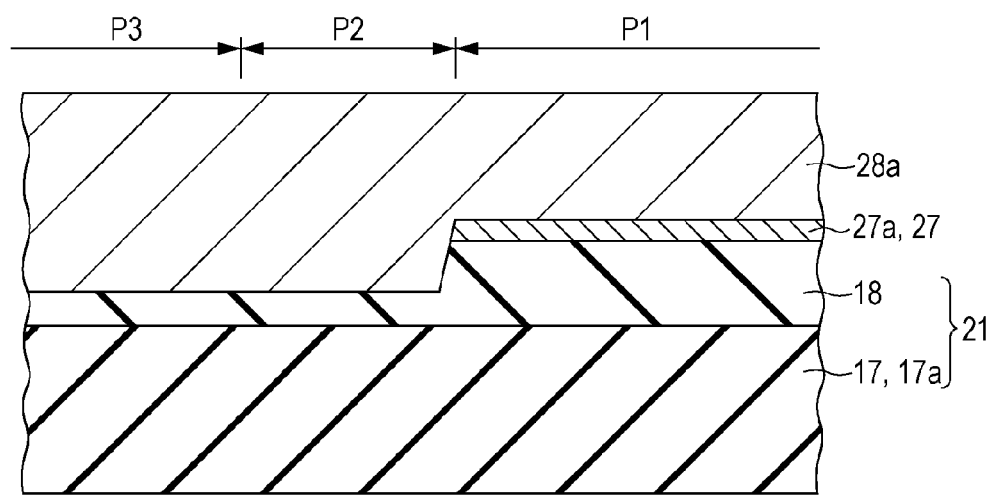

As illustrated in FIG. 7C, when the lower electrode layer 27 is formed on the insulation layer 18, the PZT layer 28a which is the piezoelectric layer 28 is formed on the entire surface on the insulation layer 18 in which the lower electrode layer 27 is formed. The PZT layer 28a is a lead zirconate titanate containing lead (Pb), titanate (Ti), and zirconium (Zr). A forming method for the PZT layer 28a is not particularly limited, and for example, a so called sol-gel method is used in which a so called sol, which is obtained by dissolving and dispersing metal organic material with catalyst, is coated and dried so as to be subjected to a gelation, and then the resultant thereof is further fired at a high temperature, such that the PZT layer 28a, which is metal oxide material is obtained. In addition, the PZT layer 28a may be formed by various methods such as a sputtering method, an IJ coating method, or the like.

For example, when the PZT layer 28a is formed by firing a precursor film formed by the sol-gel method at high temperature, the lead in the precursor film fired at high temperature is easily volatilized. For this reason, a predetermined lead is remained in the PZT layer 28a, and thus, a lead content of the precursor film is greater than that of the PZT layer 28a.

In the embodiment, the precursor film is formed in a state in which the elastic layer 17 (silicon oxide 17a) is covered with the insulation layer 18 (zirconium oxide), and the PZT layer 28a is formed by firing the precursor film at high temperature. If the precursor film is directly formed on the elastic layer 17 (silicon oxide 17a) and fired at high temperature, that is, the elastic layer 17 (silicon oxide 17a) and the precursor film are subjected to a heat process in an adjacent state to each other, excessive amount of the lead is diffused from the precursor film to the elastic layer 17 (silicon oxide 17a), and a surface shape of the elastic layer 17 (silicon oxide 17a) becomes significantly disordered. Therefore, for example, a defect is generated, such as film stacked on the elastic layer 17 (silicon oxide 17a) is peeled off.

As described from the above, the insulation layer 18 (zirconium oxide) suppresses that the lead in the PZT layer 28a is diffused to the elastic layer 17 (silicon oxide 17a) when the PZT layer 28a is formed by firing the precursor film at high temperature.

Figure 8A:
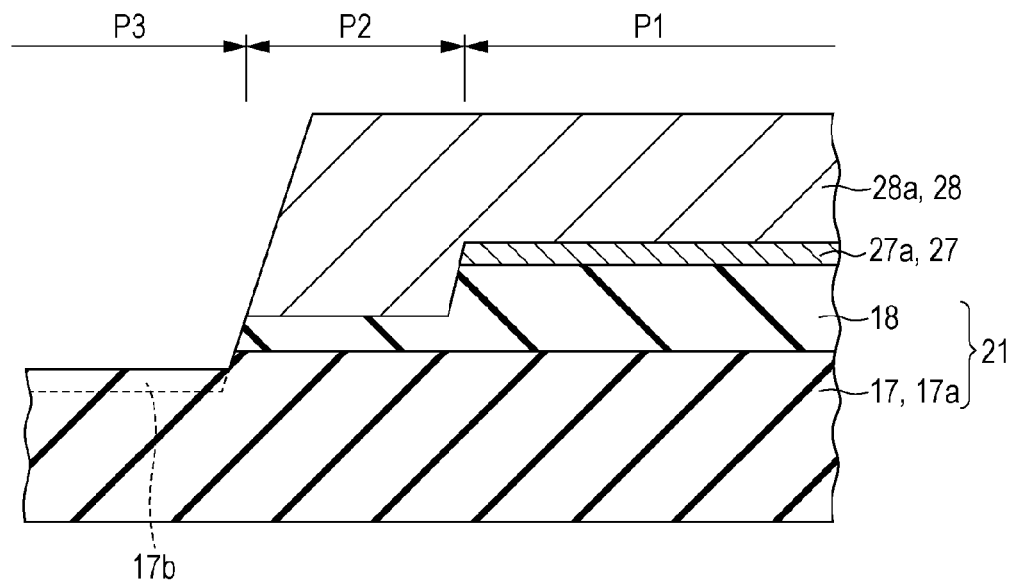
FIGS. 8A and 8B are schematic views illustrating the formation process of the vibration plate.

Subsequently, the resist pattern is formed on the PZT layer 28a as a mask with respect to the etching by the photolithographic method, and after the PZT layer 28a is patterned as a predetermined shape by dry-etching, the piezoelectric layer 28 is formed in the area P1 and the area P2. After that, the resist pattern is removed by an asking process. At this time, the etching is performed as the thickness of the PZT layer 28a or more by controlling etching time, or the like. Therefore, as illustrated in FIG. 8A, while removing the insulation layer 18 of the area P3, a part of the elastic layer 17 is also removed. Accordingly, without etching the elastic layer 17 and the insulation layer 18 corresponding to the areas P1 and P2 of the vibration plate 21, while the piezoelectric layer 28 is formed on the upper surface thereof, and the elastic layer 17 corresponding to the area P3 of the vibration plate 21 is over-etched. As a result, a step is formed on a boundary between the area P2 and the area P3 of the vibration plate 21, and the elastic layer 17 corresponding to the area P3 is formed on one step lower than the elastic layer 17 corresponding to the area P2.

In the asking process for removing a dry etching or resist described above, a process loss is generated in a tapered portion of the piezoelectric layer 28, and further, since there is a concerned that a sputtering damage is generated when a first layer of the upper electrode is formed by sputtering on the piezoelectric layer 28, a heat process for removing successive sputtering damage. By the heat process, the sputtering damage generated in the piezoelectric layer 28 is removed.

Further, by the heat process, the silicon oxide 17b (lead glass) is formed, to which the lead is added in the area P3, by diffusing the lead in the piezoelectric layer 28 to the silicon oxide 17a of the area P3 as the impurities. For details, by performing the heat process in a state in which the silicon oxide 17a, the insulation layer 18, the lower electrode layer 27, and the piezoelectric layer 28 are sequentially stacked in the area P1, the silicon oxide 17a, the insulation layer 18, and the piezoelectric layer 28 are sequentially stacked in the area P2, and the silicon oxide 17a is disposed in area P3, the lead in the piezoelectric layer 28 is diffused to the silicon oxide 17a of the area P3, and the silicon oxide 17b (lead glass) to which the lead is added in area P3 as the impurities is formed.

In other words, in a state in which the silicon oxide 17a in the area P3 is separated from the piezoelectric layer 28 of the area P1 and the area P2, the lead in the piezoelectric layer 28 is diffused to the silicon oxide 17a of the area P3. As described above, when the heat process is performed in a state in which the silicon oxide 17a and the precursor film of the piezoelectric layer 28, the defect that excessive amount of the lead is diffused to the silicon oxide 17a and the surface shape of the silicon oxide 17a is generated. When the heat process is performed in a state in which the silicon oxide 17a is separated from the piezoelectric layer 28, in comparison with the silicon oxide 17a and the piezoelectric layer 28 is subjected to the heat process in the adjacent state to each other, a diffusing amount of the lead to the silicon oxide 17a is small, and a defect can be suppressed that the excessive amount of the lead is diffused to the silicon oxide 17a, and the surface shape of the silicon oxide 17a becomes disordered.

Moreover, an amount of the lead added to the silicon oxide 17a of the area P3 as the impurities can be adjusted by a separation distance (thickness of insulation layer 18) between the silicon oxide 17a in area P3 and the piezoelectric layer 28. Accordingly, by adjusting the separation distance (thickness of insulation layer 18) between the silicon oxide 17a in area P3 and the piezoelectric layer 28, the amount of the lead added to the silicon oxide 17a in the area P3 as the impurities can be optimized.

As described from the above, in the forming method of the piezoelectric device 14 according to the embodiment, after forming the silicon oxide 17a, the insulation layer 18, and the piezoelectric layer 28 containing the lead, the insulation layer 18 and the piezoelectric layer 28 formed in the area P3 are removed, the silicon oxide 17a formed in the area P3 and the piezoelectric layer 28 are subjected to the heat process in a separated state from each other, the piezoelectric layer 28 is diffused to the silicon oxide 17a formed in the area P3, and the lead is added to the upper electrode layer 29 of the silicon oxide 17a in the area P3. In addition, in the area P3, the silicon oxide 17b (lead glass) is formed on the upper electrode layer 29 of the silicon oxide 17a to which the lead is added as the impurities.

Since the silicon oxide 17b (lead glass) to which the lead is added as the impurities has Young's modulus smaller than that of the silicon oxide 17a, the elastic layer 17 in the area P3 is easily deformed. For this reason, the vibration plate 21 which is deforms by making the vibration plate 21 in the area P3 as a fulcrum of vibration is easily bent and deformed, the bending deformation of the vibration plate 21 of the deformation portion (deformation amount of piezoelectric element 19) further increases, thereby making it possible to further achieve deformation efficient of the piezoelectric element 19.

Figure 8B:
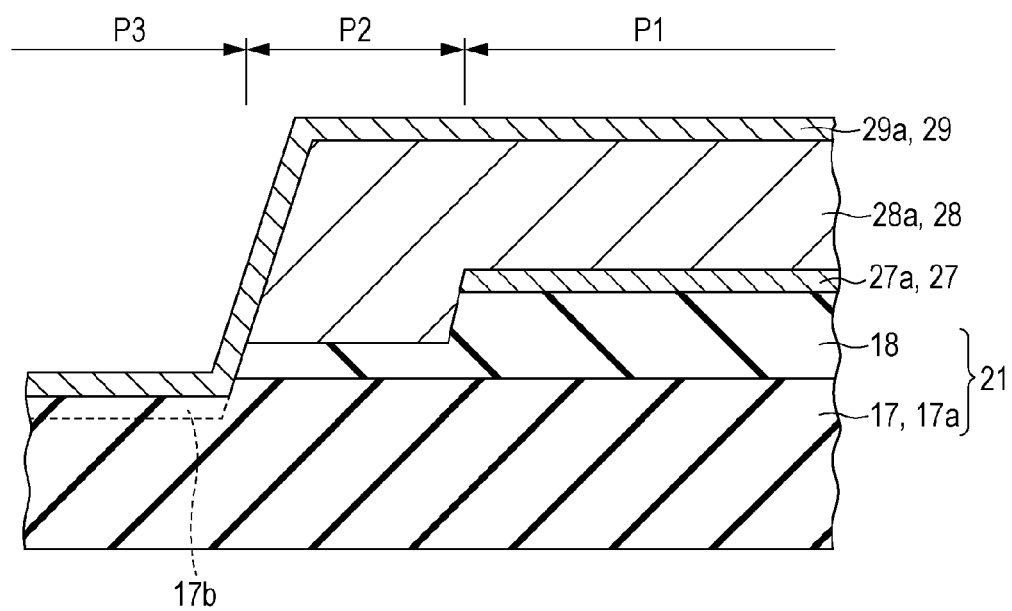

Subsequently, as illustrated in FIG. 8B, an upper metal layer 29a which is the upper electrode layer 29 is formed on the entire surface on the insulation layer 18 in which the lower electrode layer 27 and the piezoelectric layer 28 are formed by the sputtering method, or the like. The resist pattern is formed on the upper metal layer 29a as a mask with respect to the etching by the photolithographic method, and after the upper metal layer 29a is patterned as a predetermined shape by etching, the resist pattern is removed.

In this way, the piezoelectric device 14 is manufactured, which includes the area P1 in which the elastic layer 17 (silicon oxide 17a), the insulation layer 18, the lower electrode layer 27, the piezoelectric layer 28, and the upper electrode layer 29 are sequentially stacked, the area P2 in which the elastic layer 17 (silicon oxide 17a), the insulation layer 18, the piezoelectric layer 28, and the upper electrode layer 29 are sequentially stacked, and the area P3 in which the elastic layer 17 (silicon oxide 17a, silicon oxide 17b (lead glass)), and the upper electrode layer 29 are sequentially stacked.

In a manufacturing method of the piezoelectric device 14 according to the embodiment the piezoelectric device, since the deformation of the piezoelectric element 19 further achieves the efficiency without changing the thickness (reliability) of the piezoelectric layer 28, while securing the reliability of the piezoelectric element 19 the piezoelectric element 19 can further achieve a high performance. Accordingly, the piezoelectric device 14 can further achieve a high performance while securing the reliability of the piezoelectric device 14.

Further, in the forming method of the piezoelectric device 14 according to the embodiment, by a heat process for removing plasma damage, the lead in the piezoelectric layer 28 is diffused to the silicon oxide 17a in the area P3, and the lead is added to the upper electrode layer 29 of the silicon oxide 17a in the area P3 as the impurities as the impurities. Accordingly, in comparison with a case when a heat process for removing plasma damage and a heat process for diffusing the lead of the piezoelectric layer 28 are processed separately, the manufacturing method is simplified, and thus, productivity of the piezoelectric device 14 can be improved.

Moreover, an element which is added to the upper electrode layer 29 of the silicon oxide 17a in the area P3 as the impurities is not limited to the lead, and for example, it may be a 13 group element such as boron (B) or aluminum (Al), or a 15 group element such as phosphorus (P) or arsenic (As). Further, an element added to the upper electrode layer 29 of the silicon oxide 17a in the area P3 as the impurities is not limited to one element, and a plurality of different elements may be used.

Figure 9:
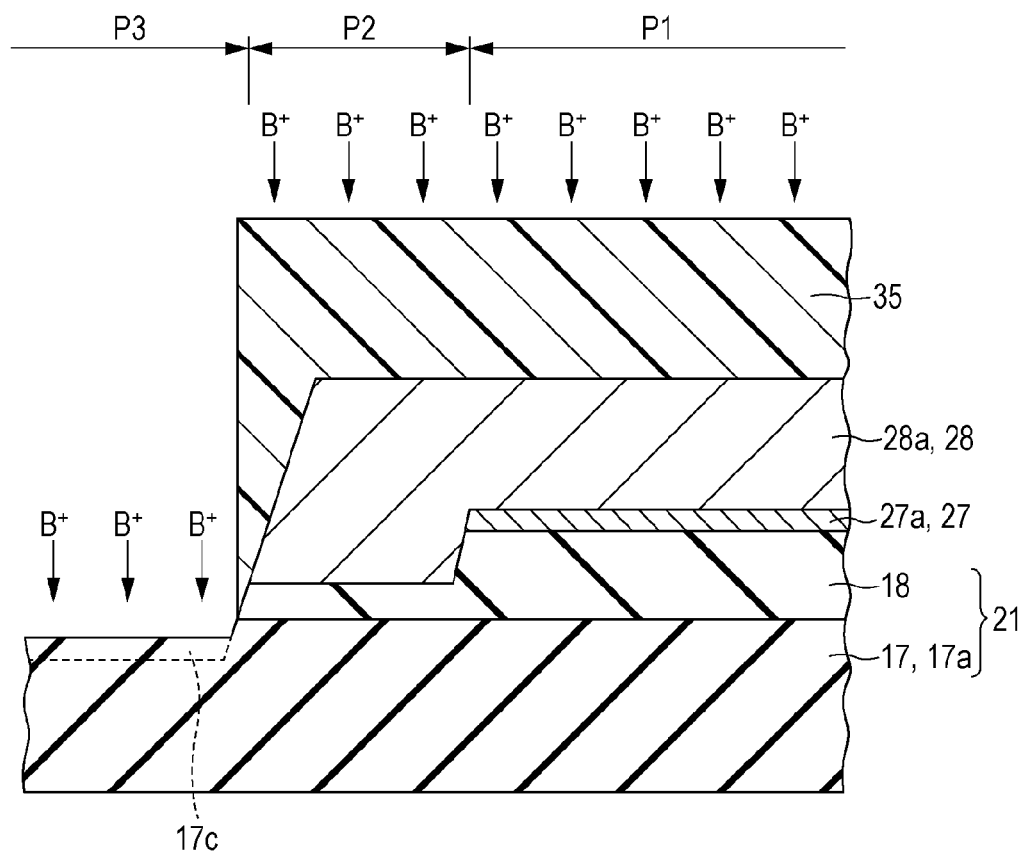
FIG. 9 is a schematic view illustrating a method for adding boron as impurities.

FIG. 9 is a view corresponding to FIG. 8A, and a schematic view illustrating a method for adding boron (B) to the upper electrode layer 29 of the silicon oxide 17a as the impurities.

As described in FIG. 9, the piezoelectric layer 28 is formed in the area P1 and the area P2, after removing the insulation layer 18 in the area P3, the area P1 and the area P2 are covered with a resist 35. As the resist 35 covering the area P1 and the area P2, the resist which is formed when the piezoelectric layer 28 is formed in the area P1 and the area P2. Further, boron ion $B^+$ is injected to the upper electrode layer 29 of the silicon oxide 17a in the area P3 using an ion injecting device. That is, boron is injected (added) to the upper electrode layer 29 of the silicon oxide 17a in the area P3 as the impurities using the ion injecting device, a silicon oxide 17c to which boron is added as the impurities is formed.

The ion injecting device is configured to have an ion source portion, a mass separation portion, an accelerating portion, a substrate holding portion, a measuring portion, and the like. Material gas (for example, diborane) is ionized in the ion source portion, unnecessary impurity ion are removed in the mass separation portion, and necessary impurity ion (for example, boron ion $B^+$) is taken out. High voltage (accelerating voltage) is applied to boron ion $B^+$ in the accelerating portion, and energy capable of driving is applied to the silicon oxide 17a in the area P3. An accelerated beam of boron ion $B^+$ is applied to a fixed substrate in the substrate holding portion, and thus, the silicon oxide 17c is formed in which boron is added to the upper electrode layer 29 of the silicon oxide 17a in the area P3 as the impurities.

When the silicon oxide 17c is formed in which boron is added to the upper electrode layer 29 of the silicon oxide 17a in the area P3 as the impurities, in the same manner as a case of forming the silicon oxide 17b in which boron is added to the upper electrode layer 29 of the silicon oxide 17a in the area P3 as the impurities, the elastic layer 17 in the area P3 is easily deformed and deformation of the piezoelectric element 19 can further achieve the efficiency by further increasing the bending deformation (deformation amount of piezoelectric element 19) of the vibration plate 21 of the deformation portion.

However, the invention is not limited to the above embodiment. For example, in the embodiment, the thickness t4 of the insulation layer 18 in the area P1 is thicker than the thickness t3 of the insulation layer 18 in the area P2; however, it is not limited thereto, and the thickness t4 of the insulation layer 18 in the area P1 and the thickness t3 of the insulation layer 18 in the area P2 can be formed to be the same as each other. In addition, the thickness t1 of the elastic layer 17 in the area P3 is thinner than the thickness t2 of the elastic layer 17 in the areas P1 and P2; however, it is not limited thereto, and the thickness t1 of the elastic layer 17 in the area P3 and the thickness t2 of the elastic layer 17 in the areas P1 and P2 can be formed to be the same as each other.

In addition, in the above described embodiment, in the area of the vibration plate 21 in the area corresponding to the pressure chamber 22, the entirety of the area in which the lower electrode layer 27, the piezoelectric layer 28, and the upper electrode layer 29 are stacked is the area P1, the entirety of the area in which the piezoelectric layer 28 and the upper electrode layer 29 deviated from the lower electrode layer 27 are stacked is the area P2, the entirety of the area in which only the upper electrode layer 29 deviated from the lower electrode layer 27 and the piezoelectric layer 28 is stacked is the area P3; however, it is not limited thereto. In each area, there may be an area having a difference thickness of the vibration plate. For example, the area in which the piezoelectric layer 28 and the upper electrode layer 29 deviated from the lower electrode layer 27 are stacked may include the area P2 configured to have the elastic layer 17 and the insulation layer 18 and an area P2' having the thickness of the vibration plate 21 thicker or thinner than that of the area P2. In addition, the area in which only the upper electrode layer 29 deviated from the lower electrode layer 27 and the piezoelectric layer 28 is stacked may include the area P3 formed of the elastic layer 17 and an area P3' having the thickness of the elastic layer 17 thicker or thinner than that of the area P3. Further, the area P1 also has the same configuration. Here, particularly, in a case in which the area P2' is thicker than the area P2, the area P2 which is greater (wider) than the area P2' has a great effect of suppressing a hindrance of the deformation of the vibration plate. In addition, the configuration is also the same as in a case in which the area P3' is thicker than the area P3. A difference in the thickness of the vibration plate in such an area may be made by manufacturing tolerance, or the like.

Figure 10:
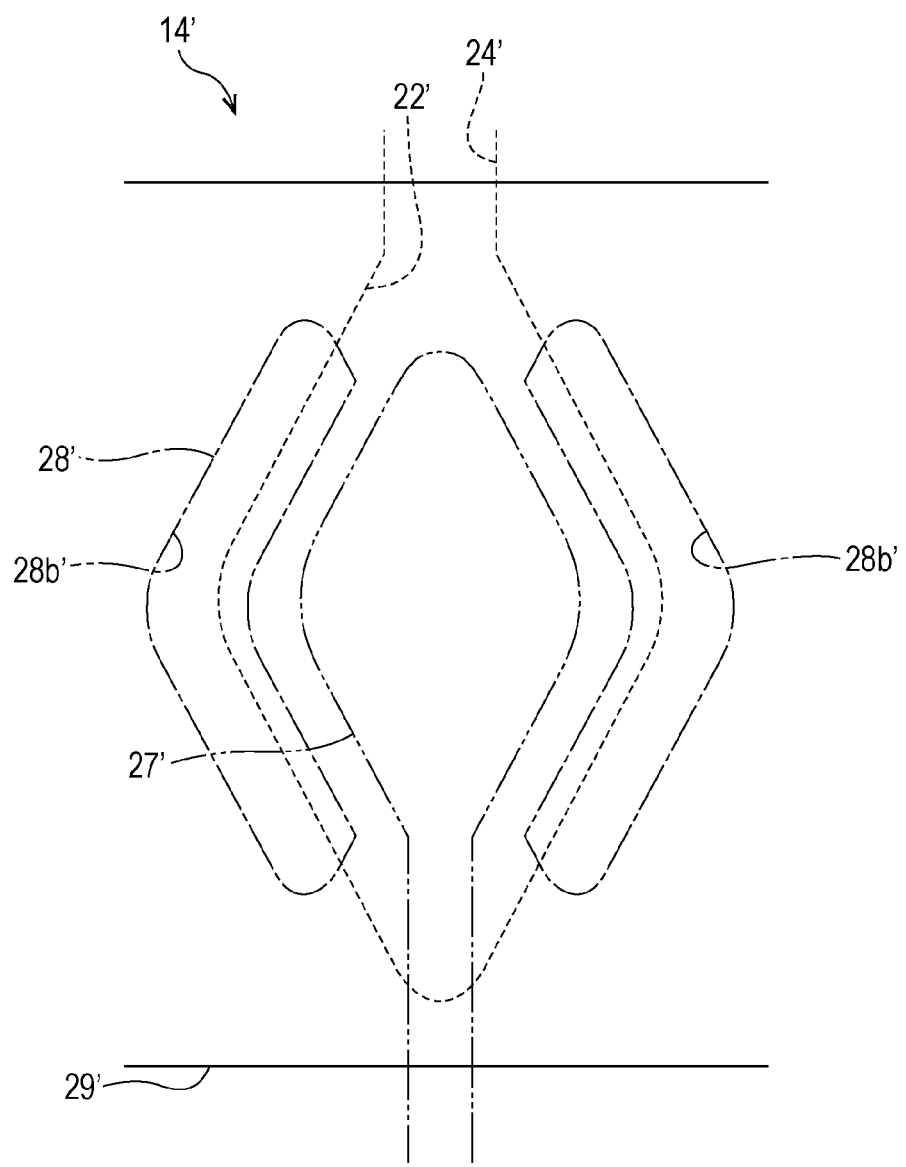
FIG. 10 is a plan view of a piezoelectric device in a second embodiment.

FIG. 10 is a plan view of the piezoelectric device according to a second embodiment.

Further, the shape of the pressure chamber 22 (pressure chamber space) is not limited to the above embodiment. For example, an inner wall surface which divides the pressure chamber space may be respectively inclined with respect to upper and lower surfaces of the pressure chamber forming substrate 15. In this case, the width of the above described pressure chamber 22 corresponds to an opening width of the upper opening of the pressure chamber space. In addition, in the above described embodiment, a plurality of the piezoelectric elements 19 is arranged in parallel along the nozzle row direction; however, it is not limited thereto. At least one piezoelectric element may be formed on the vibration plate.

In the embodiment, the upper opening of the pressure chamber space (pressure chamber 22) is a trapezoid shape, and the opening portion 28b formed on the piezoelectric layer 28 is a hexagon shape; however, it is not limited thereto. The shape of the pressure chamber space (pressure chamber), the shape of the piezoelectric layer (opening portion), the shape of each of electrode layer, and the like can be various shapes. For example, as illustrated in FIG. 10, in a piezoelectric device 14' of a second embodiment, in a plan view, the upper opening of the pressure chamber space (pressure chamber 22') is an elliptical shape. In addition, a lower electrode layer 27' is substantially an elliptical shape by matching with a shape of the pressure chamber 22'. Further, opening portions 28b' of the piezoelectric layers 28' are formed on both sides in the nozzle row direction of the pressure chamber 22' along an edge of the upper opening of the pressure chamber 22'. Moreover, in the same manner as the above described embodiment, the upper electrode layer 29' is formed so as to extend to the outside of a plurality of the pressure chambers 22' in a pressure chamber row direction (nozzle row direction). In addition, the upper electrode layer 29' in a longitudinal direction of the pressure chamber 22' extends to a position where an end portion of one side (upper side in FIG. 10) overlaps the ink supply passage 24', and an end portion of the other side (lower side in FIG. 10) extends to the outside of the pressure chamber 22'.

Here, even in the embodiment, a size of each layer in the nozzle row direction is small in the order of a width of the upper electrode layer 29', a width of the pressure chamber 22', a width of the piezoelectric layer 28', and a width of the lower electrode layer 27'. For this reason, there are the area P1 in which the lower electrode layer 27', the piezoelectric layer 28', and the upper electrode layer 29' are stacked, the area P2 in which the piezoelectric layer 28' and the upper electrode layer 29' deviated from the lower electrode layer 27' are stacked, and the area P3 in which only the upper electrode layer 29' deviated from the lower electrode layer 27' and the piezoelectric layer 28' is stacked. In addition, while removing the insulation layer of the area P3, the relationship of the thickness of the vibration plate in each of the areas P1, P2, and P3 of the vibration plate is satisfied by the expression of P1>P2>P3. Accordingly, the vibration plate is easily moved (easily deformed), the piezoelectric element can achieve the efficient deformation, and the high performance of the piezoelectric device 14'.

In addition, in the above described embodiment, the ink jet recording head mounted on the ink jet printer is exemplified; however, a configuration can also be applied to an apparatus which ejects liquid other than the ink as long as the piezoelectric device of the above described configuration is included. For example, the invention can be applied to a color material ejecting head which is used for manufacturing a color filter of a liquid crystal display, or the like, an organic electro luminescence (EL) display, an electrode material ejecting head used for forming an electrode of field emission display (FED), or the like, and a biochemical organic substance ejecting head used for manufacturing a biochip (biochemical substance element), or the like.

In addition, the invention is not limited to a use to the liquid ejecting head or the liquid ejecting apparatus as an actuator, and for example, can also be applied to the piezoelectric device, or the like which is used to various sensors, or the like.

What is claimed is:

1. A piezoelectric device comprising:
   a deformation portion in which a first supporting layer is allowed to bend and deform;
   a non-deformation portion that is adjacent to the deformation portion, and hinders bending deformation of the first supporting layer; and
   a piezoelectric element in which a first electrode layer, a piezoelectric layer, and a second electrode layer are sequentially stacked, and makes the first supporting layer bent and deformed,
   wherein the deformation portion includes a first area in which the piezoelectric element is disposed, a third area adjacent to the non-deformation portion, and a second area which is disposed between the first area and the third area,
   wherein in the first area, the first supporting layer, a second supporting layer, the first electrode layer, the piezoelectric layer, and the second electrode layer are sequentially stacked,
   wherein in the second area, the first supporting layer, the second supporting layer, the piezoelectric layer, the second electrode layer are sequentially stacked,
   wherein in the third area, the first supporting layer and the second electrode layer are sequentially stacked,
   wherein the first supporting layer is silicon oxide, and
   wherein in the silicon oxide of the third area, impurities are added to the second electrode layer.

2. The piezoelectric device according to claim 1, wherein the impurities are lead.

3. A liquid ejecting head comprising the piezoelectric device according to claim 2.

4. A liquid ejecting apparatus comprising the liquid ejecting head according to claim 3.

5. A liquid ejecting apparatus comprising the liquid ejecting head according to claim 4.

6. A liquid ejecting apparatus comprising the liquid ejecting head according to claim 3.

7. A liquid ejecting head comprising the piezoelectric device according to claim 2.

8. A liquid ejecting head comprising the piezoelectric device according to claim 1.

9. A liquid ejecting apparatus comprising the liquid ejecting head according to claim 8.

10. A liquid ejecting apparatus comprising the liquid ejecting head according to claim 9.

11. A liquid ejecting head comprising the piezoelectric device according to claim 8.

12. The piezoelectric device according to claim 1, wherein the thickness of the second supporting layer in an area in which the first electrode layer, the piezoelectric layer, and the second electrode layer are stacked is greater than the thickness of the second supporting layer in an area in the outside of the first electrode layer in which the piezoelectric layer and the second electrode layer are stacked.

13. The piezoelectric device according to claim 1, wherein a thickness of the first supporting layer in an area in which the piezoelectric layer and the second electrode layer are stacked is greater than the thickness of the first supporting layer in an area in the outside of the piezoelectric layer in which the second electrode layer is stacked on the first supporting layer.

14. A liquid ejecting head comprising the piezoelectric device according to claim 1.

15. A piezoelectric device comprising:
    a supporting body in which a second supporting layer is stacked on a first supporting layer; and
    a piezoelectric element in which a first electrode layer, a piezoelectric layer, and a second electrode layer are sequentially stacked on the second supporting layer,
    wherein the first electrode layer is formed on a first area where bending deformation of the supporting body is allowed, and the second electrode layer is successively formed from the first area to a second area in the outside of the first area, and
    wherein in the first area, the piezoelectric layer is formed up to the outside of the first electrode layer, and the second electrode layer is stacked on the first supporting layer after removing the second supporting layer in an area in the outside of the piezoelectric layer.

* * * * *